United States Patent [19]

Flamm et al.

[11] Patent Number: 4,918,031

[45] Date of Patent: Apr. 17, 1990

[54] PROCESSES DEPENDING ON PLASMA GENERATION USING A HELICAL RESONATOR

[75] Inventors: Daniel L. Flamm, Chatham Township, Morris County; Dale E. Ibbotson, Westfield, both of N.J.; Wayne L. Johnson, Phoenix, Ariz.

[73] Assignee: American Telephone and Telegraph Company, AT&T Bell Laboratories, Murray Hill, N.J.

[21] Appl. No.: 290,740

[22] Filed: Dec. 28, 1988

[51] Int. Cl.[4] .................. H01L 21/00; H01L 21/02; C23F 1/00; C23C 15/00

[52] U.S. Cl. .................. 437/225; 437/228; 437/229; 437/233; 437/235; 156/643; 156/659.1; 204/192.25; 204/192.32; 330/56; 315/39.51; 315/39.71

[58] Field of Search ............ 437/225, 228, 229, 233, 437/235, 238; 204/192.12, 192.15, 192.25, 192.32, 192.35; 427/38, 39, 50, 51; 330/56; 315/39.51, 39.71; 156/643, 646, 657, 659.1, 662

[56] References Cited

U.S. PATENT DOCUMENTS

| | | | |
|---|---|---|---|
| 4,123,663 | 10/1978 | Horiike | 204/164 |
| 4,160,690 | 7/1979 | Shibagaki et al. | 204/164 |
| 4,175,235 | 11/1979 | Niwa et al. | 204/192.32 |
| 4,233,109 | 11/1980 | Nishizawa | 204/164 |
| 4,298,443 | 11/1981 | Maydan | 204/192 |
| 4,368,092 | 1/1983 | Steinberg et al. | 204/192.32 |

FOREIGN PATENT DOCUMENTS

0100079 2/1984 European Pat. Off. .

OTHER PUBLICATIONS

MacAlpine, W., Coaxial Resonators with Helical Inner Conductor, Proceedings of the IRE, Apr. 24, 1959, pp. 2099–2105.
C. J. Mogab, *VLSI Technology*, ed Sze at McGraw-Hill, NY 1983, pp. 303–345.
Suzuki, et al., *Journal of the Electrochemical Society*, 126, 1024 (1979).
W. W. MacAlpine, et al., Proc. of IRE, p. 2099 (1959).
C. W. Haldeman et al., Air Force Research Lab Technical Research Report, 69-0148 accession No. TL501.M41, A25 No. 156.
D. L. Flamm et al. *VLSI Electronics: Microstructure Science*, vol. 8, N. G. Einspruch and M. D. Brown, eds., Academic Press, NY 1984, Chapter 8.
L. E. Katz, *VLSI Technology*, ed. Sze at McGraw Hill, NY, 1988, pp. 98–140.
A. C. Adams, *VLSI Technology*, ed. Sze at McGraw-Hill, NY 1988, pp. 238–248.
"Electronic and Photonic Applications of Polymers", Willson and Bowden eds., pp. 90–108 (American Chemical Society, Washington, D.C.) 1988.

Primary Examiner—Brian E. Hearn
Assistant Examiner—Everhart B.
Attorney, Agent, or Firm—Bruce S. Schneider

[57] ABSTRACT

Anisotropic plasma etching is accomplished utilizing a helical resonator operated at relatively low gas pressure. The use of this combination yields an extremely high flux of ionic species with resulting rapid anisotropic etching. A helical resonator in conjunction with suitable precursors is also quite useful for plasma induced deposition.

38 Claims, 4 Drawing Sheets

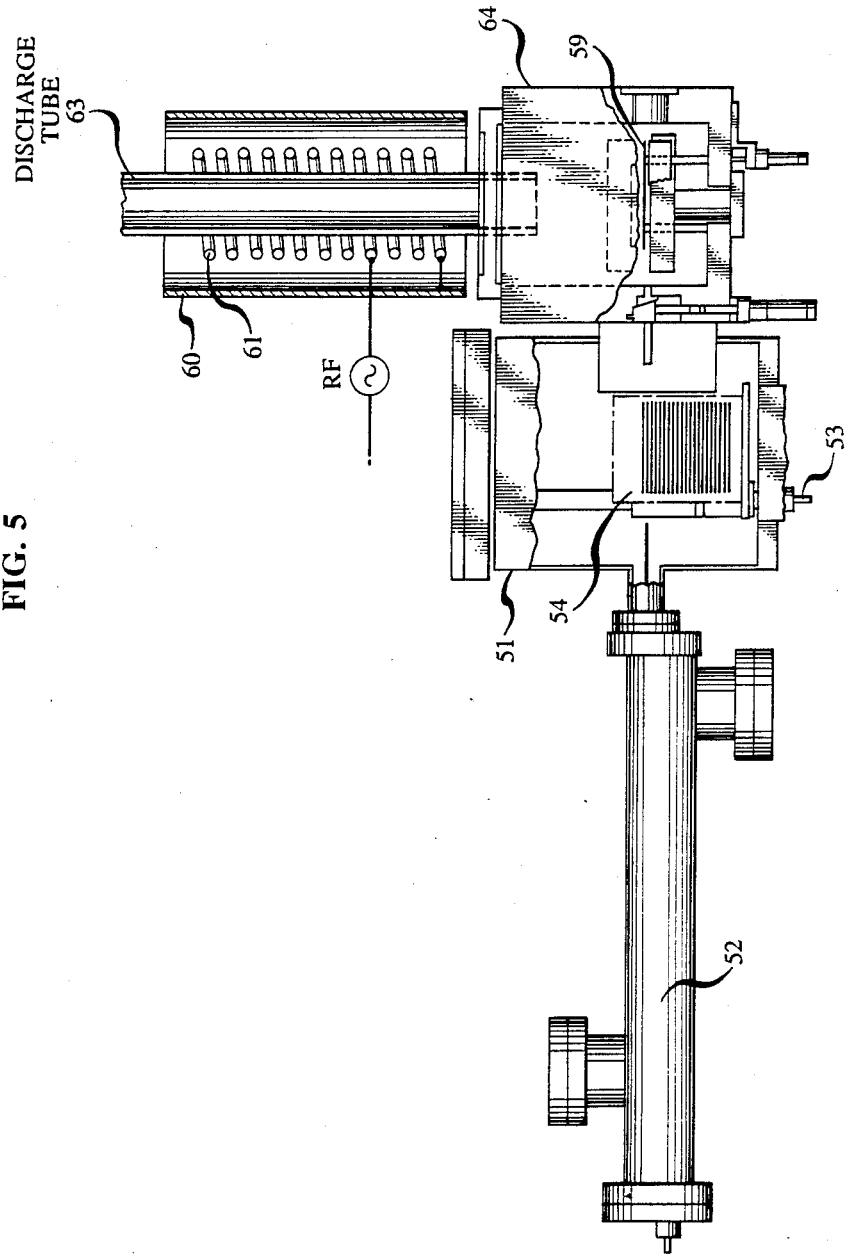

PROCESSES DEPENDING ON PLASMA GENERATION USING A HELICAL RESONATOR

BACKGROUND OF THE INVENTION

1. Field of the Invention

This invention, relates to plasma processing and in particular to plasma processing of devices.

2. Description of the Prior Art

Plasma discharges are extensively utilized in the fabrication of devices such as semiconductor devices and, in particular, silicon semiconductor devices. For example, plasma discharges in appropriate precursor gases are utilized to induce formation of a solid on a deposition substrate (One important embodiment of such a procedure is called plasma assisted chemical vapor deposition.) In a second plasma dependent procedure, species generated in a plasma are utilized to etch a substrate, e.g. a device substrate being processed which generally includes dielectric material, semiconductor material and/or material with metallic conductivity.

In plasma-assisted deposition procedures the desired solid is commonly formed by the reaction of a gas composition in a discharge. In one variation, reactive radical(s) formed in the plasma region either alone, or as mixed outside of the discharge region with a second gas, are flowed over a deposition substrate remote from the discharge to form the desired solid film. In another variation, the substrate is surrounded by a plasma which supplies charged species for energetic ion bombardment. The plasma tends to aid in rearranging and stabilizing the film provided the bombardment is not sufficiently energetic to damage the underlying substrate or the growing film.

In etching procedures, a pattern is typically etched into the substrate by utilizing a mask having openings corresponding to this pattern. This mask is usually formed by depositing a polymeric photosensitive layer, exposing the layer with suitable radiation to change the solubility of the exposed regions, and then utilizing the induced change in solubility to form the desired pattern through a solvation process.

For most present day device applications, it is desirable to produce anisotropic etching at an acceptable etch rate. (Acceptable etch rates depend upon the material to be removed and are generally those that remove at least 2% of the layer thickness in a minute. Anisotropic etching for the purpose of this description is an etch which undercuts the etch mask a distance less than one quarter the layer thickness.) The production of relatively vertical sidewalls during anisotropic etching allows higher packing densities for device structures. Additionally, the production of a relatively high etching rate leads to shorter processing times.

In one method of anisotropic etching, appropriate charged species generated in the plasma produce energetic ion bombardment that induces anisotropic etching. Various sources for producing the desired plasma discharge have been employed. For example, parallel plate reactors as described in C. J. Mogab, *VLSI Technology*, ed Sze at McGraw-Hill, N.Y. 1983, pgs. 303-345, and reactors having hexagonal electrodes as described in U.S. Pat. No. 4,298,443 dated Nov. 3, 1981 have been employed to induce anisotropic etching. Radio frequency resonators such as helical resonators have been used at pressures above 0.1 Torr as a source of etching species solely for isotropic etching. The species generated in the resonator are chemically reactive but have not demonstrated the momentum required for anisotropic etching.

As an alternative, a technique based on electron-cyclotron resonance (commonly referred to as ECR) discharges that generate high energy species for anisotropic etching has been described for the generation of ions at low pressure. (See Suzuki, et al. *Journal of the Electrochemical Society* 126, 1024 (1979).) However, the relatively high cost of an ECR is not entirely desirable. Additionally the etching of device structures suitable for 0.25 $\mu$m devices has not been reported.

SUMMARY OF THE INVENTION

It has been found that not only is electron-cyclotron resonant etching extremely expensive but also that this etching procedure under many circumstances produces rapid heating of the substrate being etched and degrades extremely fine etching patterns. It has further been found that the use of a helical resonator operating at pressures below 10 mTorr produces sufficiently energetic species to result in downstream anisotropic etching without any substantial heating of the substrate being etched. Additionally the low pressure yields etch rates faster than 500 Å/min.

Indeed, a helical resonator operating at low pressure is, in general, an excellent source of charged species for procedures such as ion implantation, surface modification, and downstream reaction to induce deposition. A helical resonator is also an excellent source of reactive radicals for inducing deposition, etching, surface cleaning, and surface modification such as a hydrogen atom source, e.g. for molecular or chemical beam epitaxy.

BRIEF DESCRIPTION OF THE DRAWING

FIGS. 1–5 are illustrative of apparatuses suitable for practicing the invention.

DETAILED DESCRIPTION

Figure 1:
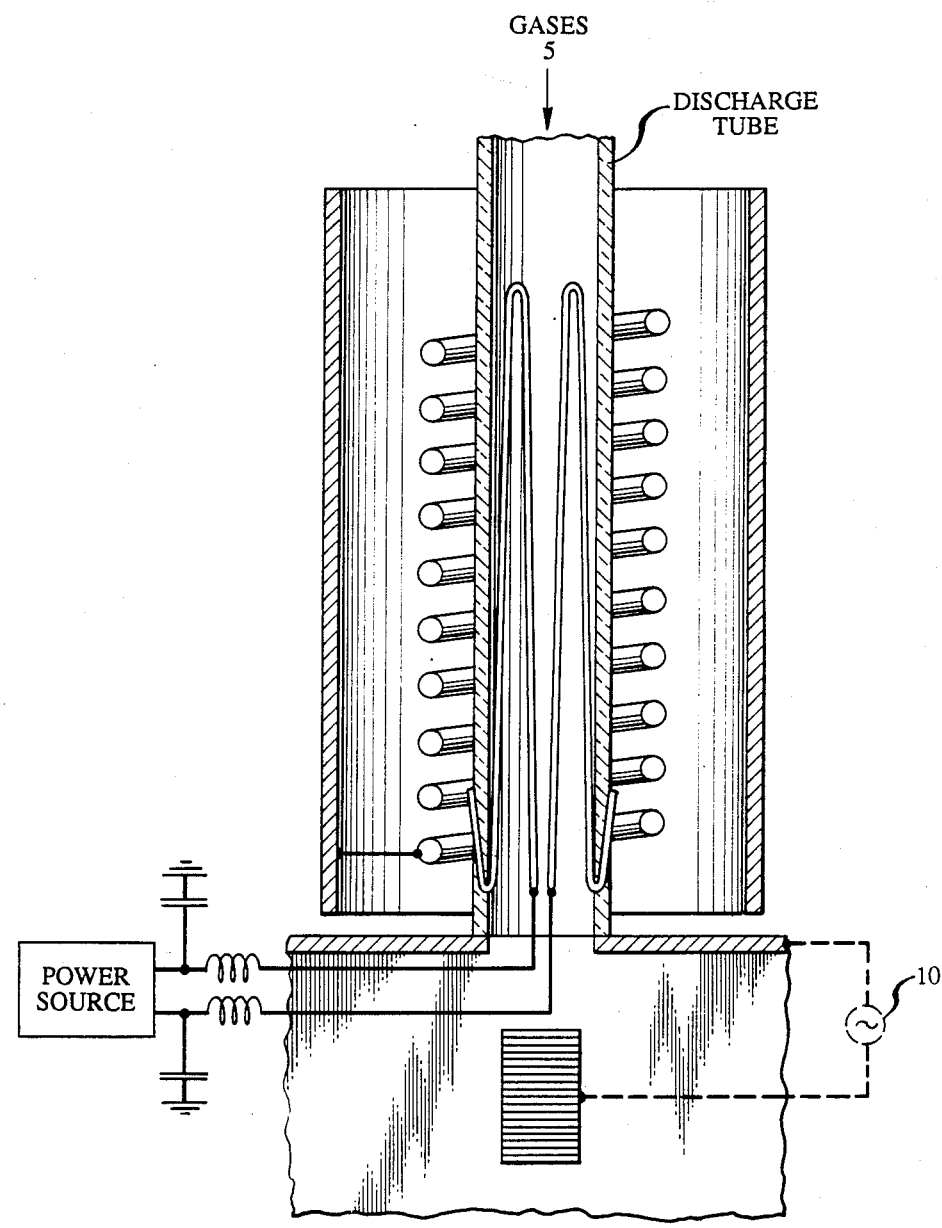

As discussed, the invention relies on the use of a helical resonator to produce a plasma in a gas at low pressure, i.e. a gas at a pressure of less than 10 mTorr for processes such as etching procedures or implantation procedures. Alternatively, a helical resonator is used to maintain a plasma in a precursor gas typically having a pressure in the range $10^{-5}$ to 100 torr for generation of species to be employed in procedures such as deposition. For pedagogic purposes, use of the helical resonator will be described in terms of the etching procedure. Conditions that differ for other uses of the generated species will subsequently be discussed.

Design of helical resonators are generally discussed in W. W. MacAlpine et al, Proc. of IRE, page 2099 (1959) and generation of a plasma with these resonators is described in C. W. Haldeman et al, Air Force Research Lab Technical Research Report, 69-0148 accession No. TL501.M41, A25 No. 156. (Although optimum resonance conditions are described by MacAlpine, for the procedures of this invention conditions substantially deviating from optimal are useful and, in fact, allow use of larger resonators. For example, a radius of the spiral coil more than 0.6 times the radius of the shield is quite useful.) The helical resonator includes an outside enclosure of an electrically conductive material, e.g. a cylinder, an internal helical coil of an electrically conductive material, if desired, an applied magnetic field in an axial direction in the region enclosed by the coil to enhance electron confinement, and means for applying an rf field to the coil. Typically, the outside enclosure and helical coil is of an electrically conductive material such as copper.

It is possible to operate the helical resonator either in a half wave mode or a quarter wave mode. It is possible in the half wave mode to connect both ends of the helical coil to the outer shield so that the resonator coil is grounded at both ends to allow the electrical matching tap or coupling to be located toward either end. In the quarter wave mode it is possible to connect one end of the coil to the outer shield and to insulate and separate the opposite end from the shield to reduce capacitance coupling. Useful processing is performed by positioning the floating end of the coil in a quarter wavelength configuration at either end.

The plasma discharge is contained within a low loss dielectric, insulating enclosure (e.g., a quartz tube) that passes through and is preferably concentric with the inner coil of the resonator. It is possible to use gas enclosure materials with higher loss or with both higher loss and higher dielectric constant. However, the former lowers the resonant "Q" of the circuit and the latter leads to not only lower "Q", but also lower resonant frequency. The enclosure dimensions should be consistent with the diameter of the helical coil and are sized to provide a relatively uniform plasma flux at the substrate that, in turn, provides a concomitantly uniform deposition or etching. (A control sample is easily employed to determine suitable dimensions for a desired flux.) Precursor gases are flowed into the enclosure, pass through the discharge and exit.

The magnetic field utilized in the region of the coil, if desired, in conjunction with the helical resonator should generally be greater than 50 Gauss as measured at the axis of the helical coil. Fields weaker than 50 Gauss do not produce substantial plasma enhancement. The frequency of the applied rf power is not critical but does affect the resulting etching. Generally, frequencies above 80 MHz lead to impractically small resonator sizes and frequencies below 3 MHz lead to plasma instabilities and excessive physical dimensions. (It is also possible to use a combination of frequencies during etching if they are resonant harmonics of each other. Resonant harmonics, however, are generally not exact multiples and a suitable frequency is obtained by tuning until a plasma together with a low standing wave ratio at the electrical transmission line are obtained.) Typically a power density generally in the range 0.05 Watts/cm$^3$ to 1 Watts/cm$^3$ of discharge volume is employed. Power densities below 0.05 Watts/cm$^3$ yield low specific ion fluxes and power densities above 1 Watts/cm$^3$ lead to excessive heating of the discharge enclosure. (Discharge volume is defined here as the volume of dielectric discharge tube enclosed by the resonator coil.)

Generally the larger the outer enclosure, the internal coil and the dielectric discharge tube, the greater the integral flux of the species produced. Typically, resonator cavities having coil diameters in the range 2.5 cm to 60 cm are utilized. Cavities smaller than 2.5 cm in diameter are less desirable because of the relatively low integral flux of ions and cavities larger than 60 cm, although not precluded, are inconvenient because of the mechanical size, the lowered resonant frequency, and the increased power required. The cavity is brought to a resonant condition by adding capacitance to the coil, adjusting the length of the coil or adjusting the rf frequency to resonance. (It is possible to extend the resonance length of a coil by increments of approximately the wavelength divided by two, e.g. $\frac{1}{2}$, 1, 3/2, 2 of the wavelength, etc. for halfwave resonators and $\frac{1}{4}$, $\frac{3}{4}$, 5/4 of the wavelength, etc. for quarter wave resonators, while maintaining the same discharge mode. This relationship is not precise because in practice, plasma loading effects and fringe capacitance influence the resonant frequency. Nevertheless, the relationship allows determination of a suitable range with precise values for a desired set of conditions determined with a control sample.) Cooling means such as circulating fluid through the coil or passing cooling gases through the resonator assembly are possible.

As discussed, it is advantageous to ground one end of the helical coil, and preferably when used in a half wave or multiple mode device both ends are advantageously grounded. (Grounding, although not essential to its operation, tends to stabilize the plasma operating characteristics. Additionally, grounding on both ends reduces the possibility of coupling stray current to nearby metallic objects.) Standard means are employed to couple rf power to the resonator. For example, a tap on the coil is made at a point where the voltage to current ratio is approximately equal to the characteristic impedance of the rf source at operation. Alternatively, it is possible to use a coupling loop.

Figure 2:
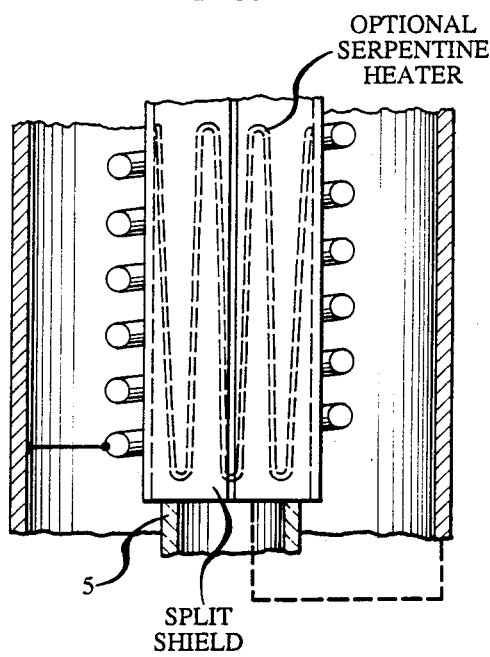

It is possible to position longitudinally conducting elements along the outside of the low loss dielectric discharge tube. For example, a heater as shown in FIG. 1 or a split metallic shield as shown in FIG. 2 are advantageously employed for many applications. The heater, in particular embodiments, is useful in deposition procedures to heat the deposition substrate when the substrate is positioned within the discharge tube or to heat species generated in the plasma for subsequent downstream etching or deposition. The shield, in particular embodiments, is useful to adjust plasma species concentrations by application of a bias or to shield the plasma region from radial electric fields. If the longitudinal conductor is employed it should not form a low impedance, conducting loop in the circumferential direction. Thus the shield is shown split in FIG. 2 and the heater although serpentine does not, as shown in FIG. 1, complete a loop within the resonator coil. (It is possible to complete the loop outside the conducting coil since the impedance of this completed portion is quite high.)

Gases for etching are introduced in the region of the helical electrode at a pressure in the range, $1 \times 10^{-5}$ Torr to 10 mTorr. Unexpectedly, relatively low pressures sustain a plasma and yield an intense flux of ions. Indeed, pressures above 10 mTorr are not desired for etching since the relative flux of ionic species that induce anisotropic etching in proportion to neutral species —neutral species tend to cause isotropic etching in the absence of sufficient ion flux —is substantially lower. Pressures below $1 \times 10^{-5}$ Torr although not precluded are also not desirable since the plasma becomes difficult to initiate and operate.

The gas employed depends upon the material to be etched. A wide variety of gases have been utilized to etch the materials typically employed in devices such as semiconductor devices. For a review of suitable etchants, for numerous material utilized in devices see D. L. Flamm et al, *VLSI Electronics: Microstructure Science,* Vol. 8, N. G. Einspruch and D. M. Brown, eds, Academic Press, New York, 1984, Chapter 8. Exemplary of such gases are chlorine, utilized to selectively etch silicon over $SiO_2$, and $NF_3$ for selective etching of $SiO_2$ over GaAs. The etching gases are advantageously introduced at one end of the resonator tube such as shown at 5 in FIG. 1. It is possible to use the etchant gas itself at a suitable pressure or to mix the etchant with other gases such as an inert gas, e.g. argon. Irrespective of the particular gas or combination of gases utilized the pressure should still be maintained elow 10 mTorr.

Figure 3:
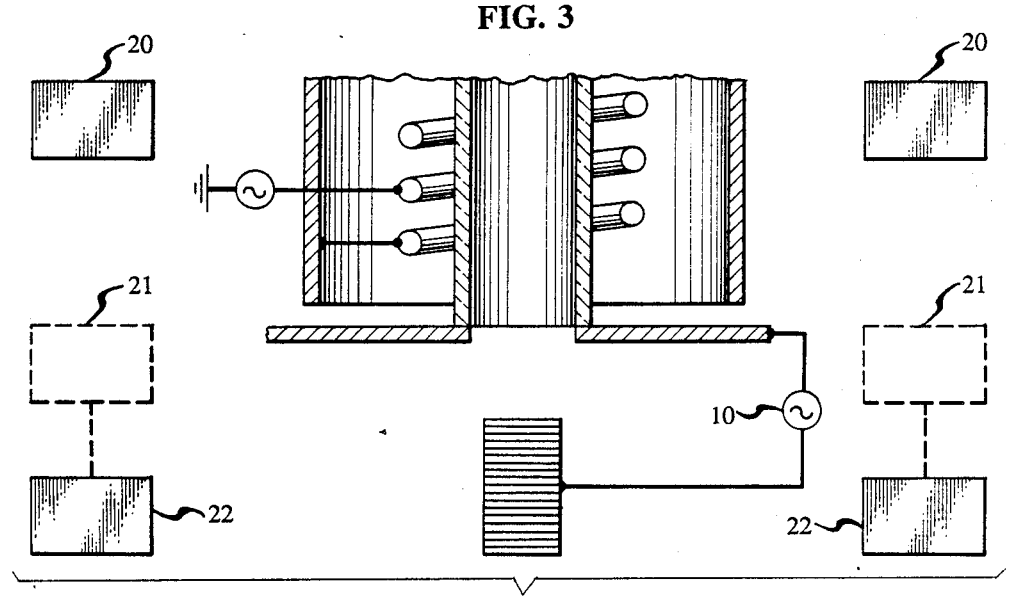

A typical configuration for downstream etching is shown in FIG. 3. The distance between the discharge and substrate depends on (1) coupling between the discharge and the etching chamber (2) the relative areas of the discharge tube cross section and the etching chamber, (3) gas pressure and (4) any additional bias employed. However, typically the substrate is placed a distance of at least 0.5 the diameter of the dielectric gas enclosure from the plasma. (For purpose of this disclosure, bias refers to a d.c. or a.c. electrical potential applied between a reference surface, e.g. the resonator shield or independent electrode, and the substrate.)

For etching anisotropically in a direction perpendicular to the surface, it is generally desirable for the major surface of the substrate to be positioned perpendicular to the direction of the ions emanating from the plasma. It is possible to bias the substrate (10 in FIGS. 1 and 3) and if desired, to pulse this bias and/or pulse the discharge itself. Pulse rates in the range 0.1 Hz to 150 kHz are useful. Pulsing of the bias is of particular use when a multilevel resist is employed with a silicon containing top level and a planarizing lower level. The use of a pulsed bias with oxygen etching species alternates etching of the underlying resist with formation of an etch resistant silicon dioxide layer on the patterned overlying resist. Thus, the pattern is transferred into the underlying resist with substantially no degradation of the overlying pattern during this transfer.

Pulsing of the discharge is advantageous, for example, when multiple plasma sources or feed gas flows are employed. With suitable pulsing the source of etching species (or deposition species in deposition processes) are controlled by a time variation in power applied to different etchant sources, e.g. completely different resonators, one resonator with a time variation in gas flow composition or other sources of chemical reactants which may optionally be partially dissociated by an additional plasma device. (Pulsing of the discharge during a deposition process also leads to increased deposition rate under appropriate conditions.)

The inventive process has been found particularly suitable for etching of devices based on extremely strict design rules, for example, a device based on 0.25 $\mu$m long gate structures of transistors. Dimensions this small generally are not adequately etched by available techniques. Nevertheless, by using a helical resonator at low pressure, extremely good resolution at an acceptable etch rate is obtained. For example, the etching of polysilicon using a chlorine discharge generated by helical resonator at a pressure of $10^{-4}$ Torr yields well resolved 0.25 $\mu$m structures separated by 0.25 $\mu$m spaces. Additionally, this structure is produced at an etching rate of approximately 200 Å/min. Thus even for extremely fine structures, anisotropic, well resolved etching is produced.

The parameters employed for species generation for other uses such as ion implantation, surface modification or multiport processing (such as a source of H atoms, or $H^+$ for molecular beam epitaxy), and downstream deposition based on the use of a helical resonator are similar to those utilized for etching. Pressures in the range $10^{-5}$ to 100 Torr are suitable for a variety of applications and the precise pressure for a given situation is determined with a control sample. The gases utilized for deposition depends on the species desired. A wide variety of gas precursors are well known for producing particular deposited material. Exemplary of suitable precursors are an $O_2$ plasma for subsequent reaction with tetraethoxysilane to deposit $SiO_2$.

Additionally, it is possible to enhance the deposition discharge by introducing an axial magnetic field in the discharge region, as in the case of etching (e.g. 20 in FIG. 3). Moreover, it is possible to further control the deposition or etching process by introducing electric and magnetic fields near the substrate region (shown in phantom at 21 and 22 in FIG. 3). It is possible to employ fields that are purely axial, purely radial, or a superposition of axial and radial fields with respect to the resonator axis.

Figure 4:
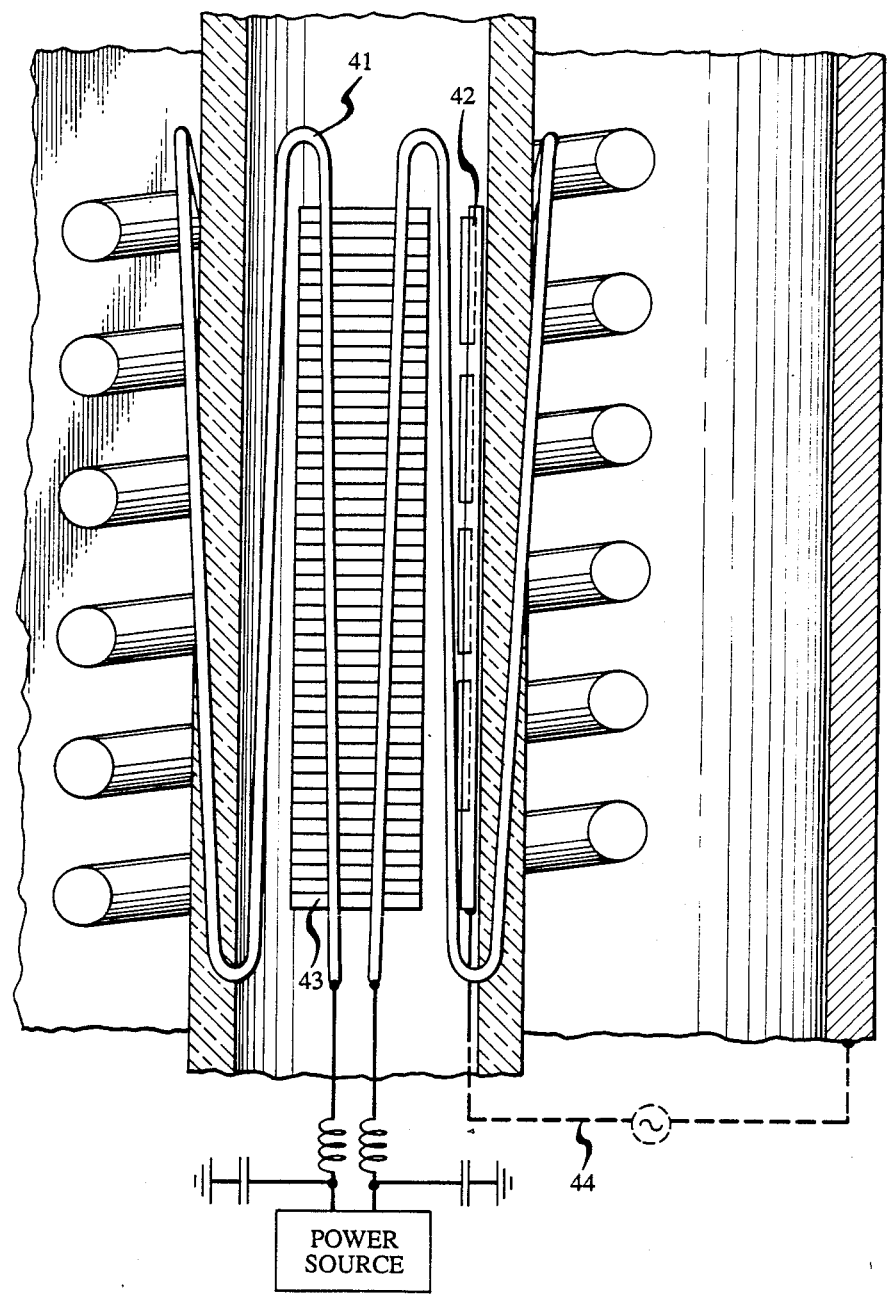

These fields are useful as shutters, as a means to direct the ions to a particular position on the substrate, as a means to alter the radial distribution of the plasma stream across the substrate diameter, or as a means to regulate impact energy. It is also possible to impose an RF electric field onto the substrate to further control ion bombardment energy during deposition or etching. The conditions of this particular mode of operation are fixed so that no discharge, or only a very weak discharge, is sustained by the RF potential unless the resonator plasma is on, i.e., a nonself-sustaining discharge is formed. In this instance the helical resonator discharge acts as a virtual electrode. Most significantly, deposition in the discharge region as shown in FIG. 4 is possible. As in etching and other deposition processes, use of a heater, 41, around substrates 42 held in a horizontal position or as shown in phantom at 43 held in a vertical position is suitable if desired. Additionally, as in other embodiments a bias, 44, to the substrate support is acceptable.

EXAMPLE 1

A 350 Å layer of $SiO_2$ was grown by the procedure described in L E. Katz, *VLSI Technology* ed. Sze at McGraw-Hill, N.Y., 1988, pgs. 98-140, on a 100 mm diameter silicon wafer with the major wafer surface oriented in the (100) plane. A 3000 Å film of undoped polycrystalline silicon was deposited by chemical vapor deposition (as described in A. C. Adams, *VLSI Technology* ed. Sze at McGraw-Hill, N.Y., 1988, pgs. 238-248), onto the silicon dioxide. An etch mask having 0.25 $\mu$m lines and varying spaces was formed by a trilevel patterning scheme, as described in "Electronic and Photonic Applications of Polymers", M. J. Bowden and S. R. Turner, eds., pp. 90-108, (American Chemical Society, Washington, D.C.), 1988. The trilevel resist included a first layer (4500 Å) of a planarizing Novalac polymer, an overlying 1200 Å thick plasma deposited $SiO_2$ layer and a top layer of an electron beam sensitive resist (chlorinated glycidyl methacrylate). The top layer was exposed to an electron beam writing apparatus producing 0.25 $\mu$m features. This pattern was transferred through the oxide layer by reactive ion etching, and the underlying layer of planarizing polymer was etched with oxygen reactive ion etching to complete the pattern transfer to the polycrystalline silicon.

The entire wafer was transferred into an etching apparatus shown in FIG. 5 via a vacuum loadlock 51, using motor drives 52 and 53 as well as wafer cassette, 54. The substrate 59 was held on a plate insulated from ground that could be biased with a separate 13.56 MHz rf source. A helium-neon laser, was used to monitor the polysilicon etch rate by laser interferometry. The reaction chamber was evacuated to a pressure of $5 \times 10^{-7}$ torr with a diffusion pump, backed by a Roots blower and mechanical pump. A quarter wave helical resonator was employed to sustain a plasma that coupled during etching to an underlying aluminum reaction chamber. The resonator, 60, was constructed from a 12 in. long, 8 in. O.D. cylindrical copper shield containing a 27 turn, 6.5 in. long, helical coil, 61, of ⅛ in. O.D. copper tubing, 4.5 in. O.D.. The fundamental resonance of this structure (approximately 8.7 MHz) varied slightly with the applied RF power and gas pressure. A 64 mm O.D. quartz discharge tube, 63, (498 cm$^3$ discharge volume within the coil) passed concentrically through the helical coil, was mated to the reaction chamber, 64, by o-ring seals, and extended 2 in. into the chamber. The end of the discharge tube was positioned approximately 6 in. from the substrate. Gases were passed through the opposite end of the tube which extended 10 in. beyond the resonator shield. The resonator was placed close to the top metal flange of the reaction chamber. A flow of air was passed through the resonator to cool the quartz tube.

Chlorine was flowed through the quartz discharge tube at 15 sccm yielding a pressure of approximately $10^{-4}$ torr within the reaction chamber. (It is possible to use small additions, e.g. 1 to 15% of oxygen to the discharge to increase the polysilicon to silicon oxide etch rate selectivity.) A discharge was initiated by 1) coupling an RF amplifier and frequency generator to the resonator coil, tuning the sine wave frequency near resonance as indicted by a sharp decrease in the voltage standing wave ratio at the input to the resonator and the appearance of a visible glow, and 2) increasing the applied power to a level of approximately 80 W. Adjustment of frequency and power were normally performed in concert. Power inputs of the resonator circuit were approximately 75 W, (0.15 W/cm$^3$ power density into the volume of the dielectric tube enclosed by the helical coil) yielding an etch rate in undoped polysilicon of 200 Å/min. (Increasing the power increased the polysilicon etch rate. Higher powers were usable but the discharge glow in the chamber became somewhat unstable). Etching was continued 1.6 times the period required to remove the exposed 3000 Å layer of polysilicon in the center of the wafer as measured by the laser interferometry. The discharge and gas flows were then extinguished and the wafer was removed for analysis.

With either Cl$_2$ or Cl$_2$/O$_2$ discharge mixtures, the etch selectivities for polysilicon over oxide and the resist were acceptable, but the selectivities were better with oxygen additions. Polysilicon/oxide selectivity was approximately 30:1 with Cl$_2$ and 70:1 with Cl$_2$/O$_2$, while the polysilicon/resist selectivity was 2.5:1 in both cases. Scanning electron micrographs of the masked regions showed smooth, nearly vertical sidewalls for the polysilicon with no undercutting.

EXAMPLE 2

The same configuration as that described in Example 1 was used except that the substrate was cooled below ambient temperature. This was accomplished by flowing cold fluid through the substrate platen and subsequently cooling the wafer to be etched by conduction. Temperature was regulated by adjusting the fluid flow or fluid temperature, or providing an additional heating source. Temperatures in the range $-180°$ to $20°$ C. were employed. Etching of the substrate was performed as in Example 1. In this case the etch selectivities for polysilicon over gate oxide and the resist were increased compared to those given in Example 1. Lower substrate temperature favored etching material with a lower activation-energy to reaction, e.g. polysilicon.

EXAMPLE 3

A similar configuration to that described in Example 1 was used to deposit silicon dioxide films. A portion of an undoped (100) silicon wafer was used as the deposition substrate. The helical resonator employed has a primary resonance of 18 MHz. The resonator excited a discharge in O$_2$ (100 sccm at 0.2 Torr) which passed through a quartz tube that was 1.4 in. O.D. The discharge tube was coupled to a quartz reactor having a heated substrate holder (430° C.). Tetraethoxysilane was introduced downstream of the discharge at a rate of 5 sccm in the region above the substrate. One hundred watts of power was applied to the resonator yield a deposition rate of 600 Å/min.

The resulting films were analyzed by fourier transform infrared spectroscopy and Rutherford backscattering spectroscopy. The analysis of the films showed essentially pure silicon dioxide. Oxide films deposited at 25° C. had a significant concentration of OH groups and a somewhat decreased firm density. However, the film composition and density were improved by using a 200 kHz RF bias (900 V peak-to-peak) on the substrate holder, to enhance ion bombardment rearrangement and stabilization of the film. The additional RF bias did not affect the discharge current flowing from the resonator plasma.

EXAMPLE 4

A hotwall, quartz discharge tube 70 cm long and 50 mm O.D. was passed through a resonator centered at 8.7 MHz. The tube was heated by a cylindrical furnace slightly smaller than the resonator coil and thermally insulated from the resonator volume having the heater element in a serpentine array so that continuity was avoided around the circumference of the heater. The heating element when mounted in this fashion did not hinder the operation of the discharge. The tube was heated to approximately 500° C. and air cooling kept the resonator components from heating excessively. Both ends of the helical coil were electrically referenced to the shield, i.e. the resonator was operated in a half wave mode and the second harmonic (approximately 18 MHz) was used.

Fluorinated silicon nitride was plasma deposited by introducing a 200 sccm flow of 1% silane in helium and a 4 sccm NF$_3$ flow directly on the silicon wafers held in the resonator discharge. Pressure in the discharge was maintained at 1 torr, the quartz wall was maintained at 350° C. and the power was 50 W. The resulting deposition rate was 200 Å/min. Analysis of the film showed nitrogen, fluorine and silicon.

EXAMPLE 5

The procedure of Example 3 was followed except the deposition rate was enhanced by turning the resonator discharge on and off with a duty cycle of 50%. This modulation of the discharge was performed in the frequency range 0.1 Hz to 20 kHz. The effect was related to forming a discharge with unreacted feed gas in the wafer region and turning the discharge off to allow more undepleted feed gas to enter the region. Enhancement in the deposition rate was approximately a factor of two over the continuous discharge mode, depending upon the modulation period.

We claim:

1. A process for fabricating a device comprising the steps of subjecting a substrate to a composition comprising entities that induce anisotropic removal of material from said substrate and employing the resulting substrate for completion of said device, characterized in that said entity emanates from a species generated in a helical resonator wherein said species is from a discharge in a gas at a pressure less than about 10 mTorr 2. The process of claim 1 wherein said device comprises a semiconductor device.

3. The process of claim 1 wherein said helical resonator is subjected to an external magnetic field.

4. The process of claim 1 wherein said helical resonator is pulsed.

5. The process of claim 4 wherein said pulsing corresponds to an associated change in processing conditions.

6. The process of claim 5 wherein said change comprises a periodic varying of said gas.

7. The process of claim 1 wherein more than one of said helical resonators is employed.

8. The process of claim 1 wherein said resonator comprises a half wave resonator or a multiple of a half wave resonator.

9. The process of claim 8 wherein said helical resonator is grounded on both ends of the helix.

10. The process of claim 1 wherein said resonator comprises a quarter wave resonator or an odd multiple of a quarter wave resonator.

11. The process of claim 10 wherein said helical resonator is grounded on one end of said helix.

12. The process of claim 1 wherein an electric field, or a magnetic field, is employed to affect the course of said species from said resonator to said substrate.

13. The process of claim 1 wherein a longitudinally conducting member having relatively low conduction circumferentially is present in said resonator.

14. A process for fabricating a device comprising the steps of subjecting a substrate to a composition of entities and employing the resulting substrate for completion of said device, characterized in that said entity emanates from a species generated in a helical resonator wherein said species is from a discharge in a gas at a pressure less than about 10 mTorr.

15. The process of claim 14 wherein said device comprises a semiconductor device.

16. The process of claim 14 wherein said helical resonator is subjected to an external field.

17. The process of claim 14 wherein said helical resonator is pulsed.

18. The process of claim 17 wherein said pulsing corresponds to an associated change in processing conditions.

19. The process of claim 18 wherein said change comprises a periodic varying of said gas.

20. The process of claim 14 wherein said resonator comprises a half wave resonator or a multiple of a half wave resonator.

21. The process of claim 20 wherein said helical resonator is grounded on both ends of the helix.

22. The process of claim 14 wherein said helical resonator is a quarter wave resonator or an odd multiple of a quarter wave resonator.

23. The process of claim 22 wherein said helical resonator is grounded on one end of said helix.

24. The process of claim 14 wherein an electric field, or a magnetic field, is employed to affect said species at said substrate or to affect the course of said species from said resonator to said substrate.

25. A process for fabricating a device comprising the steps of subjecting a substrate to a composition comprising entities that induce deposition on said substrate and employ the resulting substrate for completion of said device, characterized in that said entity emanates from a species generated in a helical resonator wherein said substrate is within said resonator.

26. The process of claim 25 wherein said helical resonator is pulsed.

27. The process of claim 26 wherein said pulsing corresponds to an associated change in processing conditions.

28. The process of claim 27 wherein said change comprises a periodic varying of the composition of said gas.

29. The process of claim 25 wherein a longitudinally conducting member having relatively low conduction circumferentially is present in said resonator.

30. The process of claim 25 wherein a bias is applied to said substrates.

31. A process for fabricating a device comprising the steps of subjecting a substrate to a composition comprising entities and employing the resulting substrate for completion of said device, characterized in that said entity emanates from a species generated in a helical resonator wherein said resonator comprises a half wave, multiple half wave, or odd multiple quarter wave resonator.

32. The process of claim 31 wherein said species is implanted in said substrate.

33. The process of claim 31 wherein said species interacts with a second species to form said entity.

34. The process of claim 33 wherein said second species is introduced downstream from said resonator.

35. The process of claim 31 wherein an electrical bias is applied to said substrates.

36. The process of claim 31 wherein a longitudinally conducting member having relatively low conduction circumferentially is present in said resonator.

37. A process for fabricating a device comprising the steps of subjecting a substrate to a composition comprising entities and employing the resulting substrate for completion of said device, characterized in that said entity emanates from a species generated in a helical resonator and said species interacts downstream with a second gas phase species.

38. A process for fabricating a device comprising the steps of subjecting a substrate to a composition comprising entities and employing the resulting substrate for completion of said device characterized in that said entity is at least in part generated due to a pulsing process in association with a helical resonator.

* * * * *

UNITED STATES PATENT AND TRADEMARK OFFICE
CERTIFICATE OF CORRECTION

PATENT NO. : 4,918,031
DATED : April 17, 1990
INVENTOR(S) : D.L. Flamm, et. al.

It is certified that error appears in the above-identified patent and that said Letters Patent is hereby corrected as shown below:

On the Title page

Item [73], "American Telephone and Telegraph Company, AT&T Bell Laboratories, Murray Hill, NJ" should read --American Telephone and Telegraph Company, AT&T Bell Laboratories, Murray Hill, NJ, as to the interest of Daniel L. Flamm and Dale E. Ibbotson--

Column 1, line 15 "substrate" should read --substrate--.

Column 5, line 7 "elow" should read -- below--

Column 7, line 56 "2.5:1" should read -- 2.5:1--

Column 8, line 21 "yield" should read --yielding--

Signed and Sealed this

Twenty-ninth Day of December, 1992

Attest:

DOUGLAS B. COMER

Attesting Officer

Acting Commissioner of Patents and Trademarks